United States Patent
Kincaid

(10) Patent No.: US 7,469,208 B1
(45) Date of Patent: Dec. 23, 2008

(54) METHOD AND APPARATUS FOR AUTOMATICALLY NORMALIZING A PERCEIVED VOLUME LEVEL IN A DIGITALLY ENCODED FILE

(75) Inventor: William S. Kincaid, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 72 days.

(21) Appl. No.: 11/433,163

(22) Filed: May 12, 2006

Related U.S. Application Data

(63) Continuation of application No. 10/192,231, filed on Jul. 9, 2002, now Pat. No. 7,072,477.

(51) Int. Cl.
  *G10L 21/00* (2006.01)
  *G10L 19/00* (2006.01)
  *H03F 7/00* (2006.01)

(52) U.S. Cl. ............... 704/224; 704/200.1; 704/225; 381/107; 381/104

(58) Field of Classification Search ............ None
See application file for complete search history.

(56) References Cited

U.S. PATENT DOCUMENTS

| | | | |
|---|---|---|---|
| 5,117,228 A | 5/1992 | Fuchigami et al. | |
| 5,796,847 A | 8/1998 | Kaihotsu et al. | |
| 5,812,969 A * | 9/1998 | Barber et al. | 704/224 |
| 5,864,794 A * | 1/1999 | Tasaki | 704/200.1 |
| 6,094,489 A * | 7/2000 | Ishige et al. | 381/60 |
| 6,108,431 A | 8/2000 | Bachler | |
| 6,266,632 B1 * | 7/2001 | Kato et al. | 704/219 |
| 6,336,219 B1 | 1/2002 | Nathan | |
| 6,370,255 B1 * | 4/2002 | Schaub et al. | 381/107 |
| 6,731,767 B1 | 5/2004 | Blamey et al. | |
| 6,865,274 B1 | 3/2005 | Aarts et al. | |
| 7,039,204 B2 * | 5/2006 | Baumgarte | 381/119 |
| 2002/0051549 A1 | 5/2002 | Uvacek et al. | |
| 2002/0076072 A1 * | 6/2002 | Cornelisse | 381/312 |
| 2003/0023429 A1 | 1/2003 | Claesson et al. | |
| 2003/0219130 A1 | 11/2003 | Baumgarte et al. | |

(Continued)

OTHER PUBLICATIONS

Li, M. McAllister et al., "Wavelet-based Nonlinear AGC Method for Hearing Aid Loudness Compensation," Vision, Image and Signal Processing, 2000, vol. 147, issue 6, pp. 502-507.

(Continued)

*Primary Examiner*—David R Hudspeth
*Assistant Examiner*—Matthew J. Sked
(74) *Attorney, Agent, or Firm*—Beyer Law Group LLP

(57) ABSTRACT

Automatically normalizing a perceived loudness for a digitally encoded audio track formed of a number of channels during playback on a multimedia asset player is described. A number of auditory selectivity frequency bands are selected and for each channel in the track, a power value for each of the number of selectivity frequency bands is computed. Each of the power values is weighted by a sensitivity weighting factor and a sum value of all the weighted power values is then calculated. For the track, a perceived acoustic power value is calculated based upon the sum value for each of the channels and a normalization gain factor based upon the perceived acoustic power is calculated and associated with the track. During playback, the normalization gain factor is applied to the track.

28 Claims, 5 Drawing Sheets

U.S. PATENT DOCUMENTS

2003/0223597 A1    12/2003    Puria et al.

OTHER PUBLICATIONS

Robinson, David, "Replay Gain—A Proposed Standard," Jul. 10, 2001, Mar. 6, 2006 <www.replaygain.org>.

Vereecken, H. et al., "Noise Suppression and Loudness Normalization in an Auditory Model-Based Acoustic Front-End," Spoken Language, 1996 vol. 1, pp. 566-569.

Vickers, Earl, "Automatic Long-Term Loudness and Dynamics Matching," Audio Engineering Society, 111th conference, 2001.

* cited by examiner

METHOD AND APPARATUS FOR AUTOMATICALLY NORMALIZING A PERCEIVED VOLUME LEVEL IN A DIGITALLY ENCODED FILE

CROSS REFERENCE TO RELATED APPLICATION

This application is a continuation of prior U.S. patent application Ser No. 10/192,231, filed Jul. 9, 2002, now U.S. Pat. No. 7,072,477, entitled "METHOD AND APPARATUS FOR AUTOMATICALLY NORMALIZING A PERCEIVED VOLUME LEVEL IN A DIGITALLY ENCODED FILE," from which priority is claimed.

BACKGROUND OF THE INVENTION

1. Field of Invention

This invention relates generally to multimedia devices. More specifically, the invention describes a method and apparatus that automatically normalizes the volume of a recording based upon both the selectivity and the sensitivity of the human auditory system.

2. Description of Related Art

Recent developments in consumer electronics have included the introduction of portable multimedia asset player devices such as MP3 players, minidisk players, and the like. For example, in the case of an MP3 player, a number of digitized audio files in the form of MP3 files are stored in a storage medium included in or coupled to the player in a fashion deemed most suitable to that user. In the case of MP3 files, a user can select and digitally encode any number of music selections each of which could have been mastered (i.e., the original recording from which all other recordings are derived) at different volume levels. Unfortunately, when these various MP3 files are played back on an appropriate MP3 player, for example, the various volume levels for each other encoded MP3 files will result in each recording having its own perceived volume forcing the user to manually re-adjust the volume, or gain, of each song thereby disrupting what would otherwise be an effortless and enjoyable listening experience by forcing the user to manually re-adjust the perceived volume, or loudness, of each song.

Therefore, what is required is a method and apparatus for automatically normalizing the volume of any number of digitally encoded multimedia asset files, (such as MP3 files) in, for example, an MP3 player.

SUMMARY OF THE INVENTION

The invention described herein pertains to a computationally efficient and automatic method and apparatus for normalizing volume between any number of digitally encoded multimedia asset files, such as MP3 files, such that the perceived volume between each of the files is substantially equivalent. Accordingly, the invention can be implemented in any number and type of devices where computational resources are limited such as multimedia asset players (MP3 players, for example)

A method for automatically normalizing a perceived loudness for a digitally encoded audio track formed of a number of channels during playback on a multimedia asset player is described. A number of auditory selectivity frequency bands are selected and for each channel in the track, a power value for each of the number of selectivity frequency bands is computed. Each of the power values is weighted by a sensitivity weighting factor and a sum value of all the weighted power values is then calculated. For the track, a perceived acoustic power value is calculated based upon the sum value for each of the channels and a normalization gain factor based upon the perceived acoustic power is calculated and associated with the track. During playback, the normalization gain factor is applied to the track.

In a digital audio system, a method of automatically normalizing a loudness level of a digitally encoded audio track having one or more channels is described. A characteristic loudness factor representing a power value associated with an audio track is calculated based upon on a selectivity model of a human ear. A normalization gain factor $G_N$ based on the characteristic loudness factor of each channel is generated and the loudness level of the audio track is normalized based upon the normalization gain factor $G_N$ which is then applied to the audio track An apparatus for automatically normalizing a perceived loudness for a digitally encoded audio track formed of a number of channels during playback on a multimedia asset player is described. The apparatus includes a means for selecting a number of auditory selectivity frequency bands. For each channel in the track, a means for computing a power value for each of the number of selectivity frequency bands, means for weighting each of the power values by a sensitivity weighting factor, means for calculating a sum value of all the weighted power values. For the track, a means for calculating a perceived acoustic power value based upon the sum value for each of the channels, a means for calculating a normalization gain factor based upon the perceived acoustic power, a means for associating the normalization gain factor with the track. During playback, a means for applying the normalization gain factor to the track.

BRIEF DESCRIPTION OF THE DRAWINGS

The invention will be better understood by reference to the following description taken in conjunction with the accompanying drawings.

DETAILED DESCRIPTION OF SELECTED EMBODIMENTS

Figure 1:
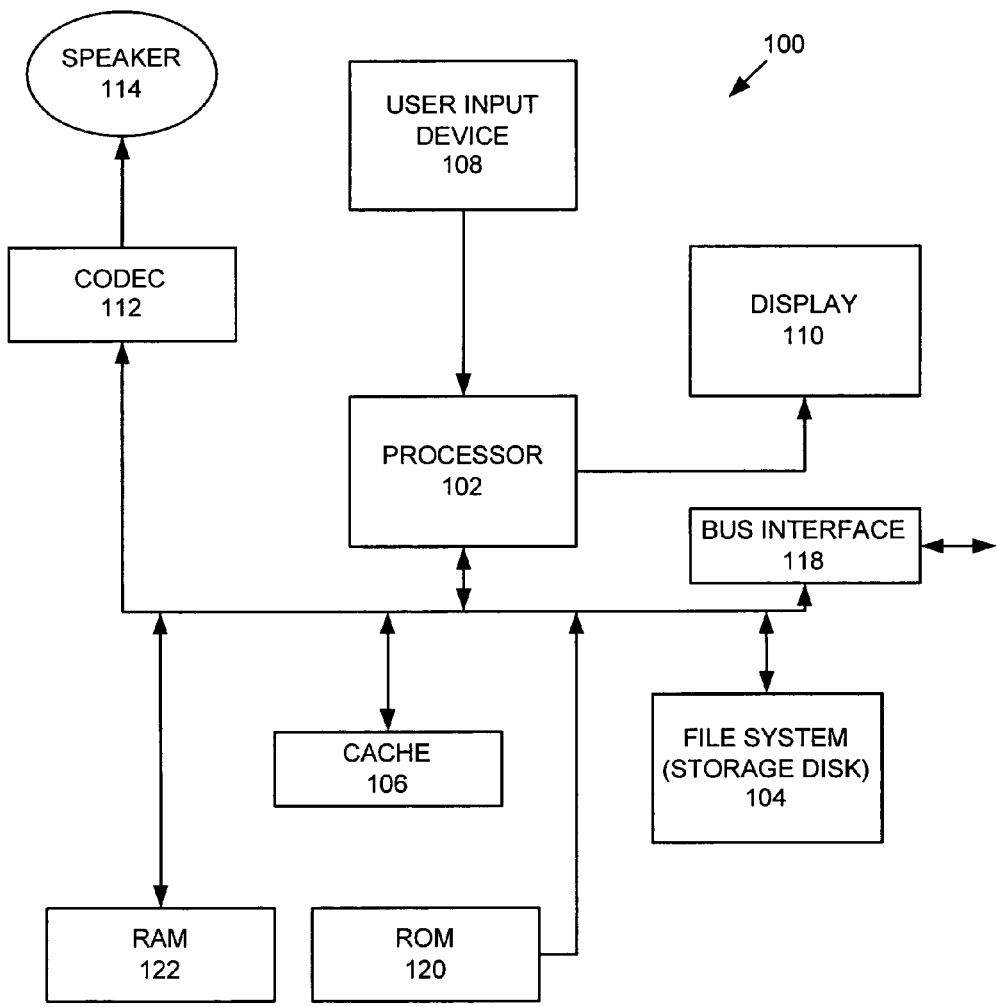
FIG. 1 shows an exemplary portable multimedia device 100 in accordance with an embodiment of the invention.

Reference will now be made in detail to a preferred embodiment of the invention. An example of the preferred embodiment is illustrated in the accompanying drawings. While the invention will be described in conjunction with a preferred embodiment, it will be understood that it is not intended to limit the invention to one preferred embodiment. To the contrary, it is intended to cover alternatives, modifications, and equivalents as may be included within the spirit and scope of the invention as defined by the appended claims.

Recent developments in consumer electronics have included the introduction of portable multimedia asset player devices such as MP3 players, minidisk players, and the like.

For example, in the case of an MP3 player, a number of digitized audio files in the form of MP3 files are stored in a storage medium included in or coupled to the player in a fashion deemed most suitable to that user. In the case of MP3 files, a user can select and digitally encode any number of music selections each of which could have been mastered (i.e., the original recording from which all other recordings are derived) at different volume levels. Unfortunately, however, when these various MP3 files are played back on an appropriate MP3 player, for example, the various volume levels for each other encoded MP3 files will result in each recording having its own perceived volume forcing the user to manually re-adjust the volume, or gain, of each song thereby disrupting what would otherwise be an effortless and enjoyable listening experience.

Previous attempts to mitigate this problem have merely relied upon determining a desired perceived loudness based upon the amplitude of the sound waves generated by the music being played back. For example, once a maximum amplitude of a recording's waveform has been determined, the loudness of the entire recording is reduced (or increased, if necessary) by decreasing (or increasing) the waveform's amplitude as desired (which in essence "stretches" the waveform). By using only the amplitude of the waveform to adjust the perceived loudness, the resulting sound quality is relatively poor since humans perceive sound based upon not the amplitude of the sound waves but the power of the waveform (which is directly proportional to the square of the amplitude). In addition, psycho-acoustic research has shown that the human ear preferentially perceives certain frequencies, or groups of frequencies, over others since in the human auditory system, it is the brain that actually processes the signals received from the human ear into recognizable tones and sub-tones.

Therefore, what is described is a method and apparatus operable in devices (such as MP3 players) having limited computational resources that automatically normalizes the volume of a recording based upon both the selectivity and the sensitivity of the human auditory system. For example, in one embodiment, a spectral analysis of a digital recording is performed based upon, for example, a Fast Fourier Transform (FFT) algorithm that provides a frequency spectrum of the recording. In some cases, in order to more efficiently process the sampled data, the samples are divided into what is referred to as frames each of which is associated with a specific number n of samples. Therefore, an entire recording, or more commonly referred to as a track, includes N frames:

$$N = T \times SR/n \qquad \text{eq. (1)}$$

T is the length of the recording (secs)
SR is the sampling rate (sample/sec)
n is number of samples per frame In the case where the sampling data has been divided into frames, therefore, all computational processing is performed on a frame-wise basis. In some embodiments, the value of n is approximately 1024 samples but of course can be any number deemed appropriate. In most situations, the recording includes multiple channels (left and right, for example) each of which is also processed independently of each other.

Any track that is going to have its playback volume adjusted (i.e., normalized) has associated with it a perceived acoustic power value that characterizes the track as a whole. By automatically adjusting the player's preamp gain to correct each track's characteristic power, perceptually uniform average power (and therefore, loudness) across multiple tracks is achieved. It should be noted that characteristic power is an inherent property of a track and is essentially independent of the track's particular encoding parameters (sampling frequency, bit rate, stereo mode, etc.). In a contemplated implementation, the perceived acoustic power value is pre-computed by a computing system separate and distinct from the multimedia asset player in those situations where the player has limited computational resources. Once computed, the perceived acoustic power value is stored in a database into which the track is stored in the form of, for example, an id tag associated with the track itself. Using the example, of the IPOD player, the perceived acoustic power value for a particular track is calculated as part of the ITUNES™ software and stored with the digitally encoded track as part of a music library. In this arrangement, the perceived acoustic power value can be calculated as part of the background process that runs when the tracks are added to the music library. In this way, the computational resources required for normalization at playback is minimal requiring only a gain adjustment (i.e., a multiplication operation) and, if desired, a simple peak limiting to guard against over amplification. In addition, since the single gain adjustment applies for the duration of the entire track, there are no associated artifacts such as "pumping" caused by dynamically altering gain during playback of a track.

In the described embodiment, the perceptual power of a track (i.e., also referred to above as the characteristic power) is calculated by measuring the weighted instantaneous spectral energies (based upon the frequency spectrum) of a set of selectivity bands of frequencies and averaging these measured energies over the duration of the track. These selectivity frequency bands are those range of frequencies that approximate the spectral selectivity of the human auditory system. (See—"Perceptual Coding of Digital Audio" by Painter and Spanias, Proceedings of the IEEE, Vol. 88, No. 4, April 2000 pp. 453-457 and "Principles of Digital Audio", by Ken Pohlmann, 4th Edition, McGraw Hill, pp. 303-310 each of which are incorporated by reference in their entirety.)

Accordingly, once each band has been identified, the power in each band is computed as a sum of the instantaneous energies of the (Fast Fourier Transform) FFT lines within that particular band. FFT is a computationally fast way of performing Fourier transformations to obtain frequency domain points equal in number to ½ the number of time samples. For example, if 480 samples are made over 10 msec (at 48 kHz sampling frequency), 240 frequency points result from this sample with maximum frequency 24 kHz and minimum freq of 100 Hz, plus a dc point. A weighted sum of these band powers is then performed where the associated weighting factors are derived from the well-known ATH ("Absolute Threshold of Hearing") curve which is also referred to as the Robinson-Dadson curve that describes the sensitivity of the human auditory response as a function of frequency. Maximum sensitivity occurs at 1 to 5 kHz, with relative insensitivity at low and high frequencies. The Robinson-Dadson equal loudness curves (highest sensitivity for human hearing is at 1-5 kHz) are a set of superimposed graphs plotting the human ear's sensitivity to sound vs. frequency, each graph representing this phenomenon at a different loudness level that the ear's subjective response to sound pressure levels plotted against frequency. Differing apparent loudness contours are expressed as phons extending from the minimum audible field at 0 phon to 120 phons and higher. For example, the energies in the frequency band around 3 kHz are weighted more heavily than those around 10 kHz.

For each audio channel, the weighted sum of the band powers is averaged over the entire track that may be done on the entire source audio stream or the track may be sampled in order to expedite the process. Once the averaged weighted power value has been computed for each channel, the track's overall perceptual power ($P_{power}$) value is defined as:

$$P_{power} = \text{MAX}(AWP_L, AWP_R)/PSF_N \qquad \text{eq. (2)}$$

where $AWP_L$ is defined as Left Average Weighted Power
$AWP_R$ is defined as Right Average Weighted Power
$PSF_N$ is defined as Normalization Power Scale Factor.

In the described embodiment, AWPL and AWPR are the averaged weighted power values for each channel and the $PSF_N$ is an arbitrary scale factor used to map the overall perceptual power to a predefined range such as 0 to approximately 232 or more typically 0 to approximately 10,000.

Since the volume gain occurs in the time domain by multiplying waveform amplitude by a gain factor G and since acoustic power is proportional to the square of waveform amplitude, in order therefore to compute a normalization gain factor $G_N$ from the track's perceptual power value $P_{power}$, the square root of the waveform's perceptual power value $P_{power}$, must be calculated. In addition, since there is an inverse relationship between gain G and power (i.e., the lower the power the higher the gain, and vice versa), the inverse of the square root of the waveform perceptual power value $P_{power}$, is calculated. Therefore, the normalization gain $G_n$ as a function of perceptual power Ppower is:

$$Gn = 1 \times \sqrt{(1/P_{power})}. \qquad \text{eq. (3)}$$

In the described embodiment, the normalization gain factor Gn is scaled by a normalization scaling factor (NSF) that results in a scaled normalization gain $G_{n,scaled}$ of 1 (i.e., no change for the "average" track). In practice, a value of NSF in the range of approximately 0 to approximately 10000 works well.

The invention will now be described in terms of a portable multimedia playback device that can take the form of a pocket sized, multimedia device (personal digital assistants, personal MP3 player/recorders, and the like) having a display screen arranged to display the various user interfaces and a corresponding user input device. The user input device is typically a manually operated switch, button, wheels, or other such contrivances. In the described embodiment, the multimedia playback device is capable of storing a number of multimedia assets such as, for example, MP3 files or other appropriately formatted files storable in an MP3 player such as the IPOD™ player manufactured by the Apple Computer Inc. of Cupertino, Calif.

It should be noted, however, that although the invention is described in terms of the multimedia playback device described above, the invention can be practiced in any appropriate general purpose computing device capable of processing digitally encoded files, including but not limited to MP3 files described herein.

Accordingly, FIG. 1 shows an exemplary portable multimedia device, or media player, 100 in accordance with an embodiment of the invention. The media player 100 includes a processor 102 that pertains to a microprocessor or controller for controlling the overall operation of the media player 100. The media player 100 stores media data pertaining to media assets in a file system 104 and a cache 106. The file system 104 is, typically, a storage disk or a plurality of disks. The file system 104 typically provides high capacity storage capability for the media player 100. However, since the access time to the file system 104 is relatively slow, the media player 100 can also include a cache 106. The cache 106 is, for example, Random-Access Memory (RAM) provided by semiconductor memory. The relative access time to the cache 106 is substantially shorter than for the file system 104. However, the cache 106 does not have the large storage capacity of the file system 104. Further, the file system 104, when active, consumes more power than does the cache 106. The power consumption is particularly important when the media player 100 is a portable media player that is powered by a battery (not shown). The media player 100 also includes a RAM 120 and a Read-Only Memory (ROM) 122. The ROM 122 can store programs, utilities or processes to be executed in a non-volatile manner. The RAM 120 provides volatile data storage, such as for the cache 106.

The media player 100 also includes a user input device 108 that allows a user of the media player 100 to interact with the media player 100. For example, the user input device 108 can take a variety of forms, such as a button, keypad, dial, etc. Still further, the media player 100 includes a display 110 (screen display) that can be controlled by the processor 102 to display information to the user. A data bus 311 can facilitate data transfer between at least the file system 104, the cache 106, the processor 102, and the CODEC 110. The media player 100 also includes a bus interface 116 that couples to a data link 118. The data link 118 allows the media player 100 to couple to a host computer that can be a stand alone host computer or part of an interconnected network of computers, such as the Internet or other such distributed systems.

In one embodiment, the media player 100 serves to store a plurality of media assets (e.g., songs) in the file system 104. When a user desires to have the media player play a particular media item, a list of available media assets is displayed on the display 110. Then, using the user input device 108, a user can select one of the available media assets. The processor 102, upon receiving a selection of a particular media item, supplies the media data (e.g., audio file) for the particular media item to a coder/decoder (CODEC) 110. The CODEC 110 then produces analog output signals for a speaker 114. The speaker 114 can be a speaker internal to the media player 100 or external to the media player 100. For example, headphones or earphones that connect to the media player 100 would be considered an external speaker. In other situations, media asset files stored on the host computer (or in other computers coupled to the host computer by way of the network) can be transferred (otherwise referred to as downloaded) to the file system 104 (or the cache 106). In this way, the user has available any number and type of media asset files for play by the media asset player 100.

For example, in a particular embodiment, the available media assets are arranged in a hierarchical manner based upon a selected number and type of groupings appropriate to the available media assets. For example, in the case where the media player 100 is an MP3 type media player, the available media assets take the form of MP3 files (each of which corresponds to a digitally encoded song or other audio rendition) stored at least in part in the file system 104. The available media assets (or in this case, songs) can be grouped in any manned deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Figure 2:
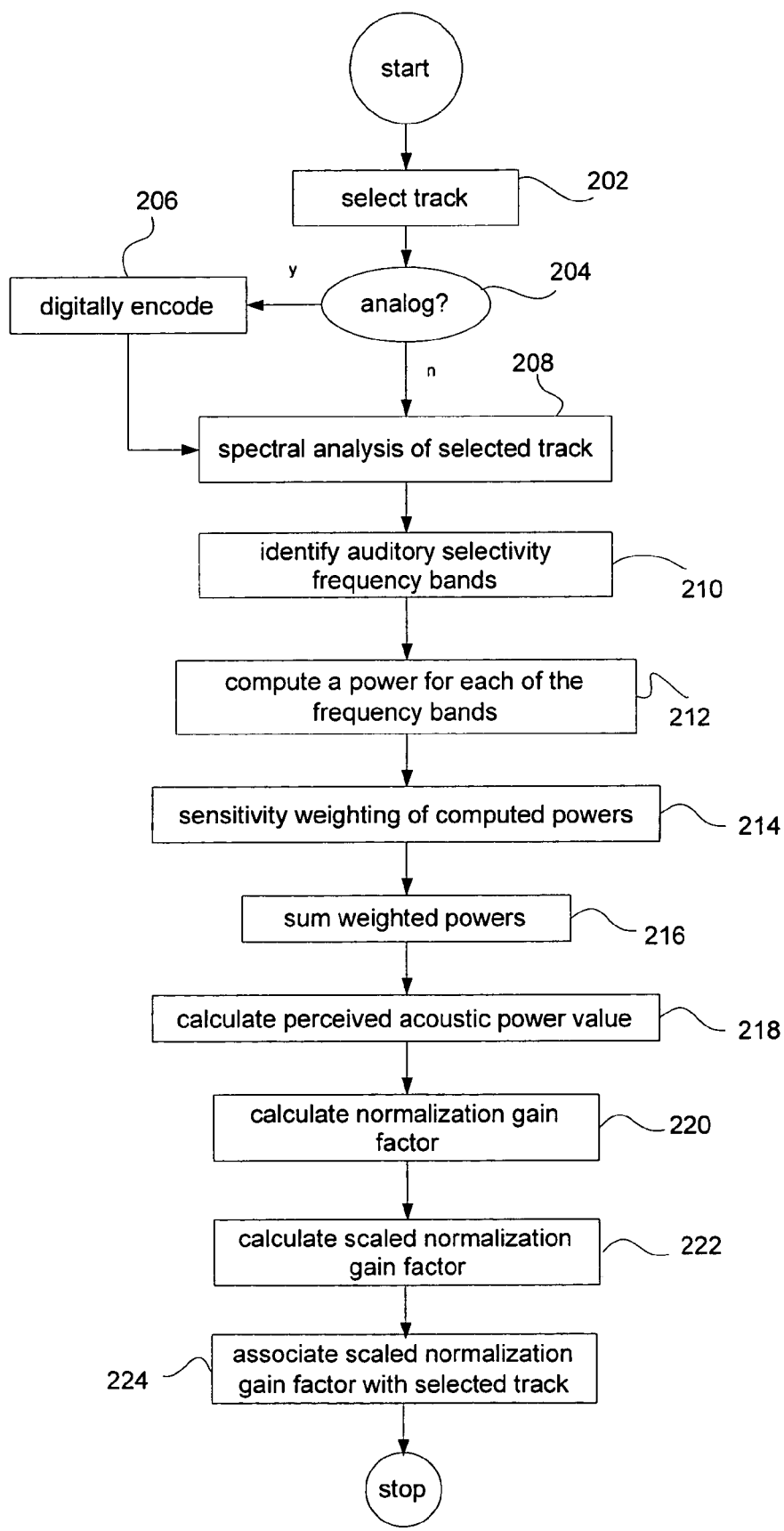
FIG. 2 shows a flowchart describing a process for providing automatically normalizing a perceived loudness for a selected track in accordance with an embodiment of the invention.

FIG. 2 shows a flowchart describing a process 200 for providing automatically normalizing a perceived loudness for a selected track in accordance with an embodiment of the invention. Accordingly, at 202 a particular track is selected. The track can take the form of a digitally encoded file (such as an MP3 file) or in the case of an analog recording at 204, the analog file is digitally encoded in any appropriate manner at 206. Although MP3 files are becoming commonplace especially with regards to the practice of "ripping and burning"

MP3 files from the Internet, there is another common type of digital audio recording that is used in compact discs and WAV files called pulse code modulation (PCM). In any case, at 208, a spectral analysis of the digital encoded file is generated. In the described embodiment, the spectral analysis can be provided using, for example, a Fast Fourier Transform (FFT) algorithm well known to those skilled in the art of digital signal processing. Next, at 210, auditory selectivity frequency bands (such as those described in Scharf) are identified as those range of frequencies that approximate the spectral sensitivity of the human auditory system. Once these bands have been identified, the power in each band is computed at 212. In the described embodiment, the band power is computed as a sum of the instantaneous energies of the (Fast Fourier Transform) FFT lines within that particular band. Next, at 214 each of the calculated band powers is weighted by an associated auditory selectivity weighting factor corresponding to the sensitivity of the human auditory system response as a function of frequency. In the described embodiment, the associated selectivity weighting factors are derived from the Robinson-Dadson curve described above. At 216, for each audio channel, a summation of the weighted band powers is then performed over the duration of the track (or the particular frame if performed in a frame wise manner). It should be noted that the averaging of the weighted sum of the band powers over the entire track which may be done on the entire source audio stream or the track may be sampled in order to expedite the process.

At 218, the ($P_{power}$) value calculated for the all channels on the track using in eq. (3) in the case of a left and a right channel. Next, at 220, a normalization gain factor GN associated with the track is calculated based upon the perceptual power value Ppower, as the inverse of the square root of the waveform's perceptual power value Ppowe. In some implementations, the normalization gain factor $G_n$ is multiplied at 222 by an arbitrary scaling factor NSF in the range of approximately 0 to approximately 10000 that results in a scaled normalization gain factor $G_n$ of 1 (i.e., no change) for the "average" track. Once the scaled normalization gain factor $G_n$ has been calculated, it is associated with the selected track at 224. This association can be accomplished in any number of ways including, but not limited to, incorporating the scaled normalization gain factor $G_n$ in a normalization information tag, for example, that includes information (in addition to the scaled normalization gain factor $G_n$) such as the track's peak amplitude and power and the corresponding time offsets where these occur. It should also be noted that in some instances, it is desirable to prevent different normalization factors for tracks that are included in a particular album. In these situations, it would be desirable to identify each track that is associated with a particular album and thereby associate a single normalization factor(s) for the tracks in an album.

Figure 3:
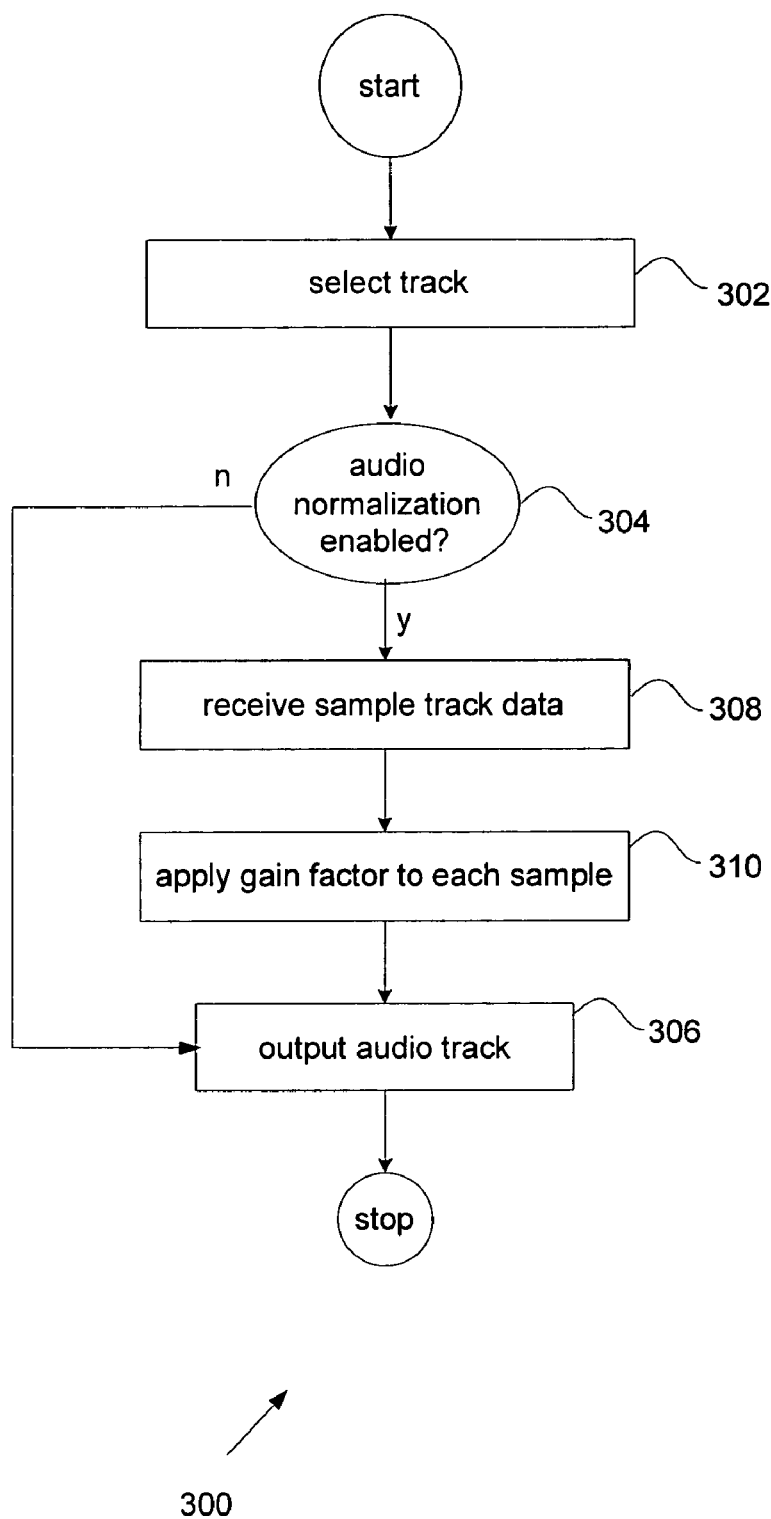
FIG. 3 illustrates a process for playing back a track in accordance with an embodiment of the invention.

Once all the appropriate normalization information is associated with a track, the track is then stored in a database (such as a music library) that is then made available to a multimedia asset player (such as the IPOD) for playback. Accordingly, FIG. 3 illustrates a process 300 for playing back a track in accordance with an embodiment of the invention. A track is selected at 302 and at 304 a determination is made whether or not an audio normalization feature is enabled on the player. In some situations, the normalization feature can be manually disabled/enabled whereas in other situations, the normalization feature is automatic in that the player determines on the fly whether or not a gain factor is associated with a track to be played and if so automatically normalizes the gain of the track. If it is determined that the normalization feature is disabled (or the track does not have a normalization factor associated with it), then the player outputs the track at 306. However, if the normalization feature is enabled, then at 308 the player receives the sample track data and applies the normalization gain factor Gn to each sample at 310 that is then output at 306.

Figure 4:
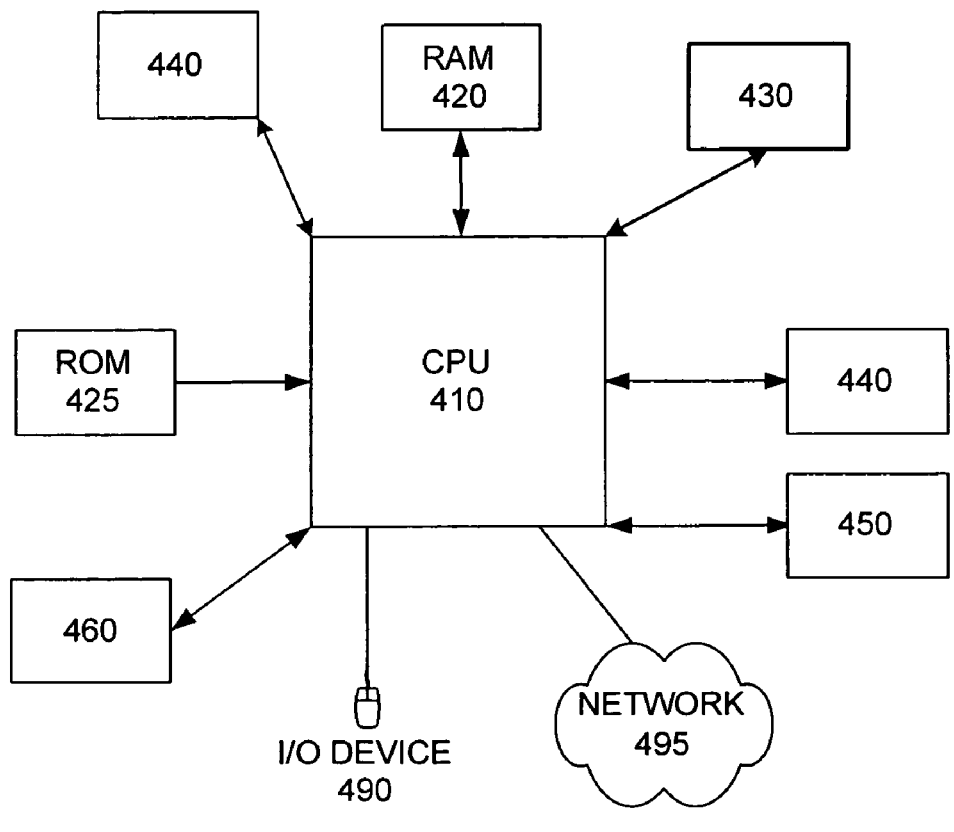
FIG. 4 illustrates a computer system employed to implement the invention.

FIG. 4 illustrates a computer system 400 employed to implement the invention. Computer system 400 is only an example of a graphics system in which the present invention can be implemented. Computer system 400 includes central processing unit (CPU) 410, random access memory (RAM) 420, read only memory (ROM) 425, one or more peripherals 430, and primary storage devices 440 and 450. As is well known in the art, ROM acts to transfer data and instructions uni-directionally to the CPUs 410, while RAM is used typically to transfer data and instructions in a bi-directional manner. CPUs 410 may generally include any number of processors. Both primary storage devices 440 and 450 may include any suitable computer-readable media. A secondary storage medium 460, which is typically a mass memory device, is also coupled bi-directionally to CPUs 410 and provides additional data storage capacity. The mass memory device 460 is a computer-readable medium that may be used to store programs including computer code, data, and the like. Typically, mass memory device 460 is a storage medium such as a hard disk or a tape which generally slower than primary storage devices 440, 450. Mass memory storage device 460 may take the form of a magnetic or paper tape reader or some other well-known device. It will be appreciated that the information retained within the mass memory device 460, may, in appropriate cases, be incorporated in standard fashion as part of RAM 420 as virtual memory.

CPUs 410 are also coupled to one or more input/output devices 490 that may include, but are not limited to, devices such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPUs 410 optionally may be coupled to a computer or telecommunications network, e.g., an Internet network or an intranet network, using a network connection as shown generally at 495. With such a network connection, it is contemplated that the CPUs 410 might receive information from the network, or might output information to the network in the course of performing the above-described method steps. Such information, which is often represented as a sequence of instructions to be executed using CPUs 410, may be received from and outputted to the network, for example, in the form of a computer data signal embodied in a carrier wave. The above-described devices and materials will be familiar to those of skill in the computer hardware and software arts.

Figure 5:
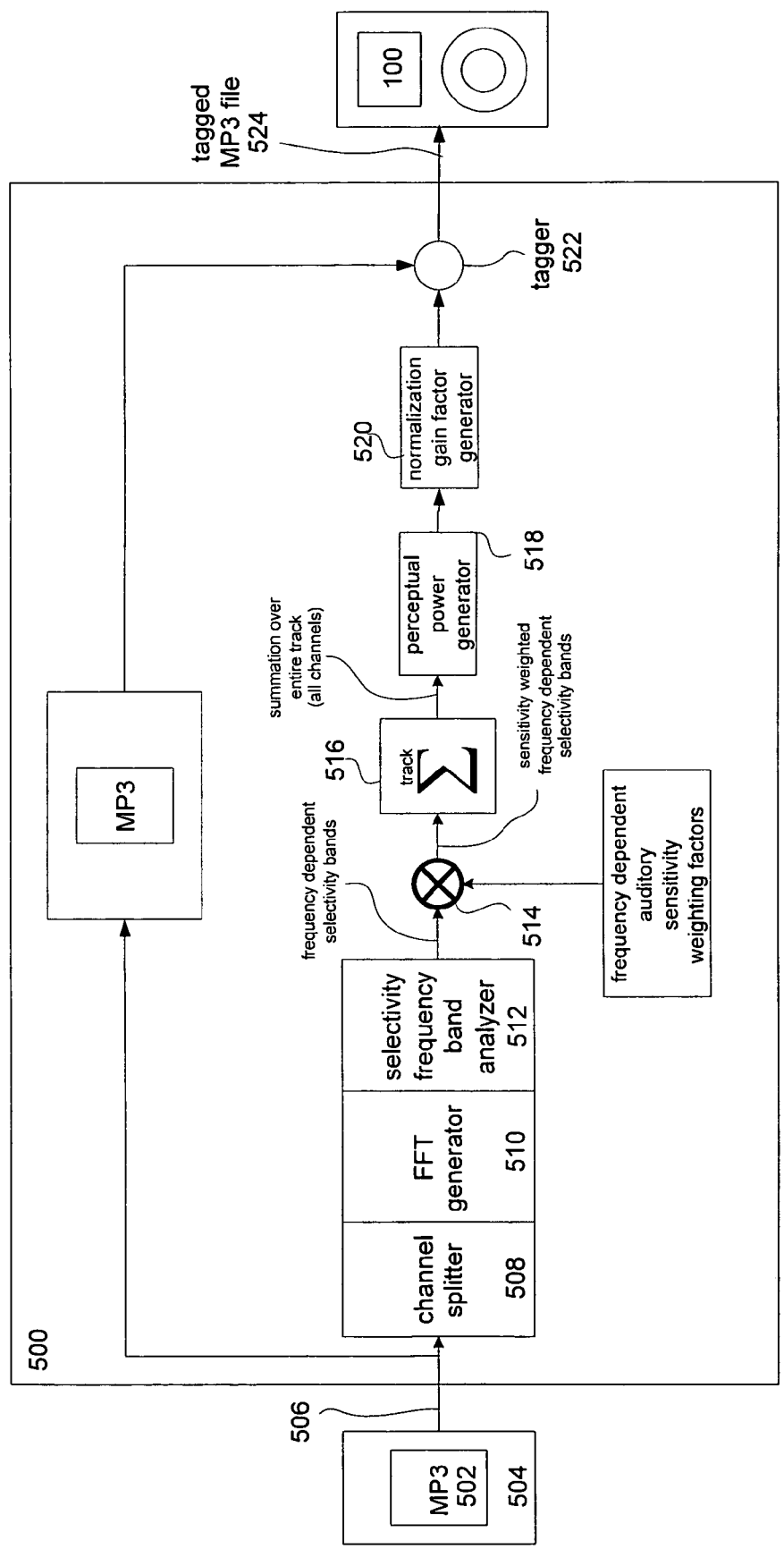
FIG. 5 shows an exemplary system for processing a digitally encoded media asset file in accordance with an embodiment of the invention.

FIG. 5 shows an exemplary system 500 for processing a digitally encoded media asset file 502 in accordance with an embodiment of the invention. Accordingly, the media asset file 502 takes the form or an MP3 file 502 stored, in for, example, a host computer 504 coupled to the system 500 by way of a bi-directional interface 506. It is contemplated that the host computer 504 can be part of a distributed network of computers such as the internet, or as part of a peer-to-peer type network of computers. In any case, the MP3 file 502 is downloaded, or otherwise, retrieved by the system 500. In most cases, the MP3 file 502 represents a digitally encoded form of a musical selection (such as a song, symphony, etc.) that includes at least 2 audio channels (left and right). Therefore, in order to process the audio channels separately, a channel splitter 508 is used to separate the MP3 audio stream into its various constituent audio channels (if there are more than one channel). The output of the channel splitter 508 is then provided to a frequency synthesizer unit that takes the form of a Fast Fourier Transform generator unit 510 that performs an FFT on each of the audio channels thereby converting the MP3 audio stream 502 from the time domain to the frequency domain in a procedure well known to those skilled in the art of digital signal processing. The output of the FFT generator 510 is then separated into selectivity frequency bands by a selectivity frequency band analyzer unit 512 where the bands those range of frequencies that approximate the spectral selectivity of the human auditory system. Each of the frequency bands is then weighted by a frequency dependent auditory sensitivity weighting factor using a convolver unit 514 that has the effect of multiplying each selectivity frequency band by a corresponding sensitivity weighting factor. A summation unit 516 then averages the weighted band powers over the length of the track and a perceived power value is calculated at 518 based upon the average weighted power. The average weighted power value is then used to calculate a normalization gain factor at a normalization gain factor generator unit 520. In the described embodiment, the normalization gain factor (which can optionally be scaled by an appropriate scale factor, if desired) is then incorporated into, or otherwise associated with, the MP3 file by way of a tagger unit 522 to form a tagged MP3 file 524. In this way, when the tagged MP3 file 524 is provided (by way of a download operation, for example) as a single file or as part of a file library, the MP3 player 100 queries the tagged MP3 file 524 in order to determine if a normalization gain factor is associated with the MP3 file 514 and, if so, use the normalization gain factor to normalize the loudness of the associated MP3 file (for either every sample or a selected number of samples).

While this invention has been described in terms of a preferred embodiment, there are alterations, permutations, and equivalents that fall within the scope of this invention. It should also be noted that there are many alternative ways of implementing both the process and apparatus of the present invention. It is therefore intended that the invention be interpreted as including all such alterations, permutations, and equivalents as fall within the true spirit and scope of the present invention.

What is claimed is:

1. A method for automatically normalizing a perceived loudness for a digitally encoded audio track formed of a number of channels during playback on a multimedia asset player, comprising:
    selecting a number of auditory selectivity frequency bands;
    for each channel in the track,
        computing a power value for each of the number of selectivity frequency bands;
        weighting each of the power values by a sensitivity weighting factor;
        calculating a sum value of all the weighted power values;
    for the track,
        calculating a perceived acoustic power value based upon the sum value for each of the channels;
        calculating a normalization gain factor based upon the perceived acoustic power;
        associating the normalization gain factor with the track; and during playback,
        applying the normalization gain factor to the track.

2. A method as recited in claim 1, wherein the auditory selectivity frequency bands are based upon a spectral selectivity of the human auditory system.

3. A method as recited in claim 1, wherein the computing a power value for each of the number of selectivity frequency bands comprises:
    generating Fast Fourier Transform (FFT) lines for each of the frequency bands;
    calculating an instantaneous energy for each of the FFT lines; and
    summing the instantaneous energies of the FFT lines within a particular frequency band.

4. A method as recited in claim 1, wherein the sensitivity weighting factor is based upon an Absolute Threshold of Hearing (ATH) curve.

5. A method as recited in claim 1 wherein the sum value is an average sum value.

6. A method as recited in claim 5, wherein the calculating a perceived acoustic power value, comprises:
    determining a maximum average sum value for all channels; and
    dividing the maximum average sum for all channels by a power scale factor used to map the perceived acoustic power value to a predefined range.

7. A method as recited in claim 6 wherein the predefined range is approximately 0 to approximately 10,000.

8. A method as recited in claim 1, wherein the calculating a normalization gain factor Gn comprises:
    calculating an inverse value of the perceived acoustic power value; and
    calculating a square root value of the inverse value.

9. A method as recited in claim 8, further comprising:
    calculating a scaled normalization gain factor by,
    multiplying the normalization gain factor by a normalization scaling factor (NSF) wherein the normalization scale factor takes on a value such that the scaled normalization gain factor is substantially equal to 1.0 representative of a no change condition for an average track.

10. A method as recited in claim 9, wherein a value of the NSF is in the range of approximately 0 to approximately 10000.

11. A method as recited in claim 9, wherein the associating comprises:
    incorporating the scaled normalization gain factor into a tag;
    associating the tag with the track.

12. A method as recited in claim 9, wherein applying comprises:
    multiplying each sample of the track by the associated scaled normalization gain factor.

13. A method as recited in claim 9, wherein applying comprises:
    multiplying selected samples of the track by the associated scaled normalization gain factor.

14. A method as recited in claim 1, wherein the digitally encoded audio track is an MP3 type audio track.

15. In a digital audio system, a method of automatically normalizing a loudness level of a digitally encoded audio track having one or more channels, comprising:
    generating a characteristic loudness factor representing a power value associated with an audio track, weighted on a selectivity model of a human ear, wherein the characteristic loudness factor for a particular track is obtained by
    calculating a power value for a band of frequencies,
    generating a sensitivity-weighted power value based upon a frequency based power sensitivity factors, and
    summing the sensitivity weighted power values over a duration of the track to provide a characteristic loudness factor;

calculating a normalization gain factor $G_N$ based on the characteristic loudness factor of each channel;

normalizing the loudness level of the audio track based upon the normalization gain factor $G_N$; and applying the normalization gain factor $G_N$ to every sample on the audio track.

16. A method as recited in claim 15, wherein the band of frequencies comprises human auditory system selectivity frequency bands.

17. A method of normalizing volume as recited in claim 15, where the sum of the sensitivity-weighted power values is calculated over the entire digitally encoded audio track.

18. A method of normalizing volume as recited in claim 15, where the sum of the sensitivity-weighted power values is calculated by periodically sampling the digitally encoded audio track.

19. A method as recited in claim 15, wherein the associated selectivity weighing factors are based upon a Robinson-Dadson curve.

20. In a digital audio system, a method of automatically normalizing a loudness level of a digitally encoded audio track having one or more channels, comprising:

generating a characteristic loudness factor representing a power value associated with an audio track, weighted on a selectivity model of a human ear;

calculating a normalization gain factor $G_N$ based on the characteristic loudness factor of each channel;

normalizing the loudness level of the audio track based upon the normalization gain factor $G_N$; and applying the normalization gain factor $G_N$ to every sample on the audio track, wherein the digitally encoded audio track comprises a left channel having an Average Weighted Power for Left Channel ($AWP_L$) and a right channel having an Average Weighted Power for Right Channel ($AWP_R$), and wherein a perceptual power $P_{power}$ for each track is determined by, calculating the maximum value (MAX) of the Left Average Weighted Power $AWP_L$ and the Right Average Weighted Power $AWP_R$ to form a resulting power;

dividing the resulting power by a Normalization Power Scale Factor $PSF_N$, wherein the Normalization Power Scale Factor $PSF_N$ is selected to be a scaling factor used to map an overall perceptual power to a predefined range of frequencies.

21. A method of normalizing volume as recited in claim 20, wherein the range of scale factors is approximately 0 to approximately 10,000.

22. A method of normalizing volume as recited in claim 20, wherein a perceptual power $P_{power}$ for each track is determined by:

calculating a root mean square value (RMS) of the Left Average Weighted Power $AWP_L$ and the Right Average Weighted Power $AWP_R$ to form a resulting power;

dividing the resulting power by the Normalization Power Scale Factor $PSF_N$, which is selected to be a scaling factor used to map the overall perceptual power to a predefined range.

23. In a digital audio system, a method of automatically normalizing a loudness level of a digitally encoded audio track having one or more channels, comprising:

generating a characteristic loudness factor representing a power value associated with an audio track, weighted on a selectivity model of a human ear;

calculating a normalization gain factor $G_N$ based on the characteristic loudness factor of each channel;

normalizing the loudness level of the audio track based upon the normalization gain factor $G_N$; and applying the normalization gain factor $G_N$ to every sample on the audio track, wherein the digitally encoded audio track comprises a left channel having an Average Weighted Power for Left Channel ($AWP_L$) and a right channel having an Average Weighted Power for Right Channel ($AWP_R$), and wherein a perceptual power $P_{power}$ for each track is determined by:

calculating the average value (AVG) of the Left Average Weighted Power $AWP_L$ and the Right Average Weighted Power $AWP_R$;

dividing the result by a Normalization Power Scale Factor $PSF_N$, which is selected to be a scaling factor used to map the overall perceptual power to a predefined range.

24. A method as recited in claim 23, wherein the normalization gain $G_N$ is calculated based upon the inverse of the square root of the waveform's perceptual power $P_{power}$.

25. A method of normalizing volume as recited in claim 23, further comprising:

calculating the inverse of the perceptual power $P_{power}$;

calculating a scaled normalization gain factor $G_N$ by multiplying the inverse of the perceptual power $P_{power}$ by a scaling factor NSF such that the normalization gain of an average track is 1.

26. A method of normalizing volume as recited in claim 25, further comprising:

associating the scaled normalization gain factor $G_N$ with the selected digitally encoded audio track.

27. A method as recited in claim 26, wherein the associating comprises:

forming an ID tag corresponding to the track; and incorporating the scale factor into the ID tag.

28. An apparatus for automatically normalizing a perceived loudness for a digitally encoded audio track formed of a number of channels during playback on a multimedia asset player, comprising:

means for selecting a number of auditory selectivity frequency bands;

means for computing a power value for each of the number of selectivity frequency bands means for weighting each of the power values by a sensitivity weighting factor for each channel in the track;

means for calculating a sum value of all the weighted power values for each channel in the track;

means for calculating a perceived acoustic power value based upon the sum value for each of the channels for the track;

means for calculating a normalization gain factor based upon the perceived acoustic power for the track;

means for associating the normalization gain factor with the track; and means for applying the normalization gain factor to the track during playback.

* * * * *